United States Patent
Chan

(12) 
(10) Patent No.: US 10,440,818 B1
(45) Date of Patent: Oct. 8, 2019

(54) FLEXIBLE CIRCUIT BOARD SUBSTRATE AND METHOD OF MANUFACTURING THE SAME

(71) Applicant: Shirre Lab Corp., Taipei (TW)

(72) Inventor: Shih-Ing Chan, Taipei (TW)

(73) Assignee: Shirre Lab Corp., Taipei (TW)

( * ) Notice: Subject to any disclaimer, the term of this patent is extended or adjusted under 35 U.S.C. 154(b) by 0 days.

(21) Appl. No.: 16/022,366

(22) Filed: Jun. 28, 2018

(30) Foreign Application Priority Data

May 29, 2018 (TW) .............................. 107118246 A

(51) Int. Cl.
| | |
|---|---|
| H05K 1/02 | (2006.01) |
| H05K 1/11 | (2006.01) |
| H05K 3/42 | (2006.01) |
| H05K 3/46 | (2006.01) |
| H05K 3/28 | (2006.01) |
| H05K 1/05 | (2006.01) |
| H05K 3/00 | (2006.01) |

(52) U.S. Cl.
CPC ............. *H05K 1/028* (2013.01); *H05K 1/056* (2013.01); *H05K 1/115* (2013.01); *H05K 3/28* (2013.01); *H05K 3/423* (2013.01); *H05K 3/429* (2013.01); *H05K 3/4652* (2013.01); *H05K 1/0201* (2013.01); *H05K 1/0298* (2013.01); *H05K 1/111* (2013.01); *H05K 3/0026* (2013.01); *H05K 3/0047* (2013.01); *H05K 2201/0129* (2013.01); *H05K 2203/0723* (2013.01); *H05K 2203/107* (2013.01)

(58) Field of Classification Search
CPC .......... H05K 1/028; H05K 3/28; H05K 1/115; H05K 3/423; H05K 3/429; H05K 3/4652; H05K 2203/107; H05K 2201/0129; H05K 3/0047; H05K 3/0026; H05K 2203/0723
See application file for complete search history.

(56) References Cited

U.S. PATENT DOCUMENTS

| | | | | |
|---|---|---|---|---|
| 6,579,437 B2 * | 6/2003 | Mitsuhashi | ............. | C23C 28/00 205/141 |
| 6,591,495 B2 * | 7/2003 | Hirose | ................. | H05K 3/0035 174/264 |
| 9,161,460 B2 * | 10/2015 | Ha | ......................... | H05K 3/383 |
| 2004/0001325 A1 * | 1/2004 | Wang | ..................... | H05K 3/002 361/762 |
| 2011/0127074 A1 * | 6/2011 | Takahashi | ................ | C25D 3/38 174/257 |
| 2012/0189859 A1 * | 7/2012 | Nozaki | ................... | B32B 15/08 428/458 |

* cited by examiner

*Primary Examiner* — Ishwarbhai B Patel

(57) ABSTRACT

This present invention provides a flexible circuit board substrate including: a conductive material layer with a first surface, a second surface opposite to the first surface, and at least one via hole throughout the first surface and the second surface; a first surface-treated layer with a plurality of first particles and a plurality of second particles formed on the first surface and/or the second surface, wherein each first particle has a diameter greater than that of each second particle; and an insulating structure formed on the first surface-treated layer and filled up with the via hole, and a method of manufacturing the same.

4 Claims, 11 Drawing Sheets

FLEXIBLE CIRCUIT BOARD SUBSTRATE AND METHOD OF MANUFACTURING THE SAME

This application claims the benefit of TW invention patent application No. 107118246, filed on May 29, 2018, and the entirety of which is incorporated by reference herein.

BACKGROUND OF THE INVENTION

Field of the Invention

The present invention relates to a circuit board substrate of a printed circuit board, and in particular relates to a circuit board substrate for mobile communication applications and a method of manufacturing the same.

Description of the Related Art

With the trends of intelligent electronic apparatus, a printed circuit board needs to equip with electronic devices with various functions within a limited capacity. The layout of the conventional rigid printed circuit board is hard to be adjusted by reducing its thickness owing to the rigid substrate thereof. On the contrary, the flexible printed circuit (FPC) has been widely used in the intelligent electronic apparatuses owing to features of thin films, flexible arrangement and 3-dimensional layouts.

Taking the mobile communication as an example, a mobile communication apparatus comprises a plurality of functional wires including a high speed processor, various memories, wireless communication device and so on. Therefore, the flexible printed circuit board not only possess excellent conductivity and insulation but also meets the requirements of low noise and interference resistance. The FPC substrate usually is usually formed by stacking a conductive material such as copper and an insulating material such as polyimide, liquid crystal polymer or fluorine-polymer. Owing to different physical and chemical properties of the conductive material and the insulating material, the stacking structure formed by these two materials will suffer from poor adhesion or existing a gap therebetween resulting from different thermal expansion coefficients between these two materials and resulting in poor conductivity and insulation, which will lead the FPC to not meet the requirements of mobile communication. It's well known to solve the problem of poor adhesion between the conductive material and the insulating material by assembling or mixing thermalsetting materials and thermalplastic materials to produce a stacking insulating structure for the flexible printed circuit board.

FIG. 1A-1C are cross-sectional views of a method of manufacturing a conventional multi-layered printed circuit board. As shown in FIG. 1A, a polyimide film 110 with a thickness of 1-30 μm is provided as a core layer, and two fluorine-containing resin layers 111 with a thickness of 1-50 μm are respectively coated on the top surface and the bottom surface of the polyimide film 110. The fluorine-containing resin layers 111 can be consisted of a material comprising for example but not limited to tetrafluoroethylene-perfluorinated alkyl vinyl ether copolymer (PFA). Next, an insulating layers stacking body 11 can be generated after the outermost surfaces of those two fluorine-containing resin layers 111 are pressed under a temperature higher than the melting point of the fluorine-containing resin layers 111. Then, two copper coils 120 with a thickness less than 10 μm are formed on those two fluorine-containing resin layers 111, and a double-coiled substrate 12 can be generated after those two copper coils 120 are pressed under a temperature higher than the melting point of the fluorine-containing resin layers 111 to make those two copper coils 120 attached onto the fluorine-containing resin layers 111.

As shown in FIG. 1B, the insulating layers stacking body 11 can be generated by above-mentioned steps. First, a copper coil 120 with a thickness less than 10 μm are formed on one of the fluorine-containing resin layers 111, and a single-coiled substrate 13 can be generated after the copper coil 120 is pressed under a temperature higher than the melting point of the fluorine-containing resin layer 111 to make the copper coil 120 attached onto the fluorine-containing resin layer 111. Next, the copper coil 120 can be patterned into a copper coil pattern 121 formed on the fluorine-containing resin layer 111 by photolithography and etching process. Then, the fluorine-containing resin layer 111 of the single-coiled substrate 13 is faced to one of the copper coil pattern 121 of the double-coiled substrate 12 to make the singled-coiled substrate 13 attached to the double-coiled substrate 12 by pressing under the temperature higher than the melting point of the fluorine-containing resin layer 111 and generate a multi-layered flexible printed circuit board 1 as shown in FIG. 1C.

However, the multi-layered flexible printed circuit board manufactured by above-mentioned method is extremely limited to the physical and chemical characteristics such as melting point and linear thermal expansion factor of the thermalplastic fluorine-containing resin, and the the multi-layered flexible printed circuit board manufactured by above-mentioned method still suffers from the problems of planarity, insulation, thickness and peeling strength.

SUMMARY OF THE INVENTION

To achieve above-mentioned purposes, this present invention provides a flexible circuit board substrate, comprising: a conductive material layer with a first surface, a second surface opposite to the first surface, and at least one via hole throughout the first surface and the second surface; a first surface-treated layer with a plurality of first particles and a plurality of second particles formed on the first surface and/or the second surface, wherein each first particle has a diameter greater than that of each second particle; and an insulating structure formed on the first surface-treated layer and filled up with the via hole.

According one embodiment of this invention, the conductive material layer has a thickness of 6-70 μm, and the via hole has a diameter not greater than 1 mm.

According one embodiment of this invention, the insulating structure comprises a thermalplastic insulating material or a thermalsetting insulating material.

According another embodiment of this invention, the insulating structure comprises a thermalplastic insulating material and a thermalsetting insulating material.

According one embodiment of this invention, the thermalsetting material is sandwiched by two of the thermalplastic material.

According another embodiment of this invention, the thermalplastic material is sandwiched by two of the thermalsetting materials.

According one embodiment of this invention, the flexible circuit board substrate further comprising: a circuit layer formed on the insulating structure; and a conductive plug formed in one of the via hole to interconnect with the circuit layer.

To achieve above-mentioned purposes, this present invention provides a method of manufacturing a flexible circuit board substrate, comprising the steps of: providing a conductive material layer with a first surface and a second surface opposite to each other; forming a first surface-treated layer on the first surface and/or the second surface of the conductive material layer; forming at least one via hole throughout the first surface and the second surface; and forming an insulating structure on the first surface-treated layer.

According one embodiment of this invention, wherein the first surface-treated layer is formed by the steps of: forming a plurality of first particles on the first surface and/or the second surface; and forming a plurality of second particles on the first surface and/or the second surface, wherein each first particle has a diameter greater than that of each second particle.

According one embodiment of this invention, wherein the via hole is formed by a mechanical or laser drilled process.

According one embodiment of this invention, wherein the insulating structure is formed by the steps of: providing an insulating stacking layer comprising a first insulating material sandwiched by two of the second insulating materials; disposing the insulating stacking layer on the first surface-treated layer; hot pressing the insulating stacking layer to make the second insulating material of the insulating stacking layer fill up with the via hole; and curing the second insulating material to form the insulating structure.

According one embodiment of this invention, wherein the first insulating material and the second insulating material can be a thermalplastic material, a thermalsetting material or combinations thereof.

According one embodiment of this invention, wherein the insulating structure is formed by the steps of: coating an insulating material on the first surface-treated layer and filling up with the via hole; and curing the insulating material to form the insulating structure.

According one embodiment of this invention, further comprising the steps of: forming a circuit layer on the insulating structure; forming a conductive channel throughout the circuit layer and the insulating structure, and; filling a conductive material into the conductive channel to formed a conductive plug.

Another feature of this invention provides another method of manufacturing a flexible circuit board substrate as mentioned above, further comprising a clean step by a basic detergent to remove metallic powders and/or insulating powders generated during the laser drilling step.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific exemplary embodiments discussed are merely illustrative of specific methods to make and use the embodiments, and do not limit the scope of the disclosure.

Exemplary Embodiment 1

Figure 1A:
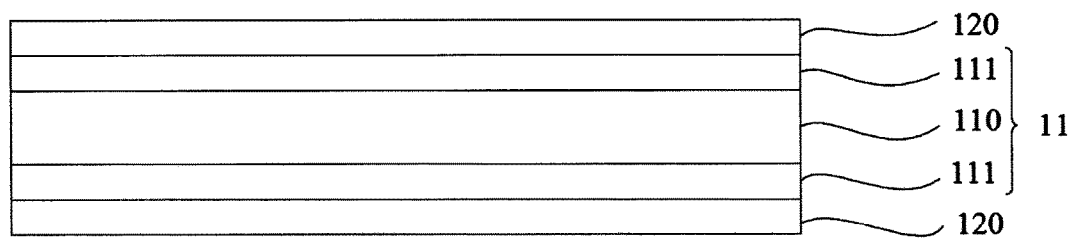
FIGS. 1A-1C are cross-sectional views illustrating a method of manufacturing the conventional multi-layered flexible printed circuit board.
Figure 1B:
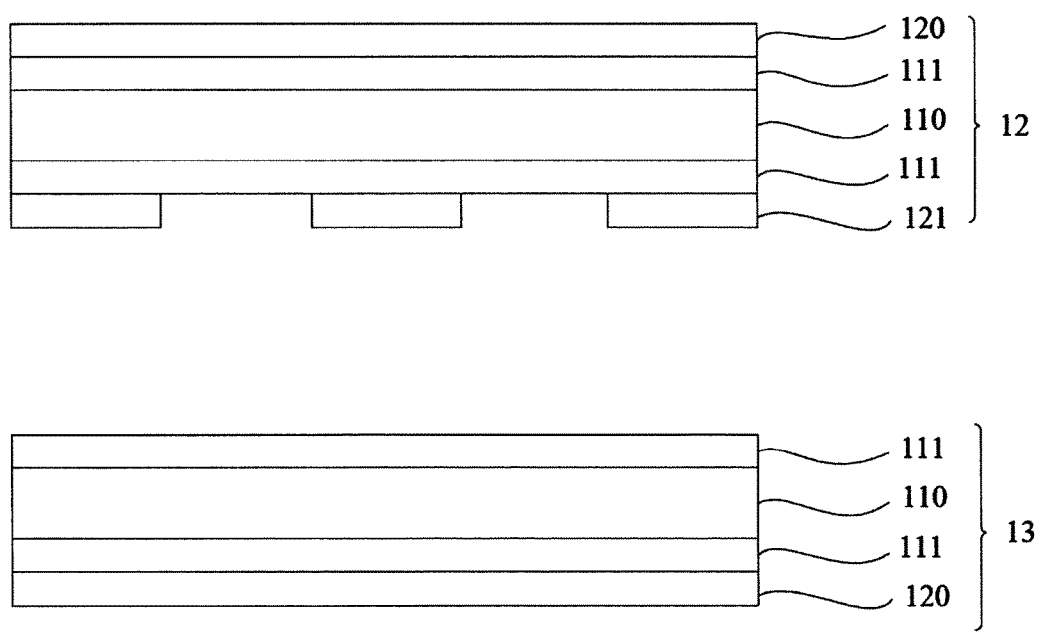
Figure 1C:
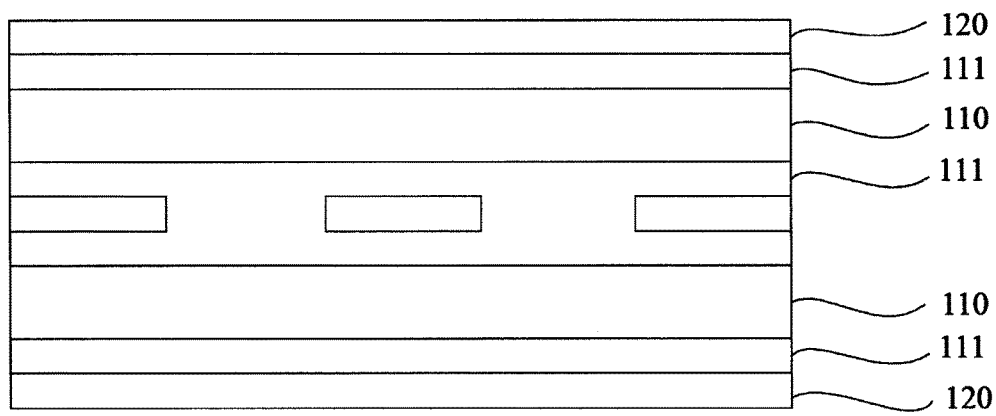
Figure 2A:
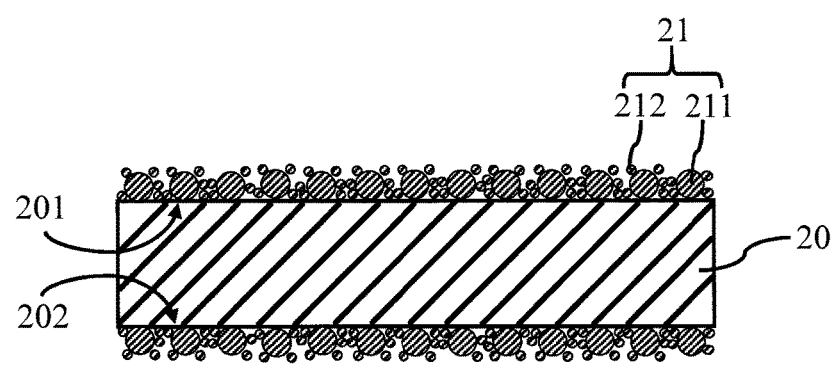
FIGS. 2A-2C' are cross-sectional views illustrating a method of manufacturing a flexible printed circuit board substrate according to one embodiment of this invention.

First, please refer to FIG. 2A. As showing in FIG. 2A, a conductive material layer 20 with a first surface and a second surface opposite to each other is provided. The conductive material layer 20 can be for example but not limited to a copper foil, a copper alloy foil, a gold foil or an aluminum foil. The copper foil can be for example but not limited to the electrolytic copper foil or the rolled & annealed copper foil. The electrolytic copper foil can be generated by depositing a copper layer on a titanium or stainless surface by electrolysis of cupric sulfate solution first and peel off the copper layer from the titanium or stainless surface afterward. The rolled copper foil can be generated by repeatedly pressing a copper plate by a roller first and annealing afterward. The conductive material layer 20 is acting as a ground layer of a flexible printed circuit board (FPC) used in high frequency applications to provide functions of supporting and heat dissipation. Accordingly, a conductive material layer 20 with insufficient thickness cannot provide good supporting and heat dissipation; a conductive material layer 20 with an over thickness will affect the flexibility and the fitting of the flexible printed circuit board. Therefore, a suitable thickness of the conductive material layer 20 is in the range of 6 to 70 μm, exemplary 9 to 35 μm and preferably 35 to 70 μm.

The conductive material layer 20 and the insulated stacking layer are key factors for a flexible printed circuit board substrate to meet the requirements of a FPC. For example, the compactness and peeling strength between the insulated stacking layer and the conductive material layer 20 can be enhanced by forming a uneven surface on the conductive material layer 20. According to this present embodiment, a plurality of first particles 211 are electroplated or coated on the first surface 201 and/or the second surface 202 of the conductive material layer 20, and a plurality of second particles 212 are electroplated or coated afterwards to form a first surface-treated layer 21 to provide the conductive material layer 20 with a uneven surface, wherein the diameter of each first particle 211 is greater than that of each second particle 212.

The first particles 211 can be formed by selecting from one of the materials including copper, nickel, phosphor, tungsten, arsenic, molybdenum, chromium, ferrum, vanadium, cobalt and zinc or the combinations thereof, and electroplating on the first surface 201 and/or the second surface 202 of the conductive material layer 20 by two stages. The first stage is to form particle cores by electroplating at a current density of 48 to 60 A/dm² and a total current of 70 to 90 As/dm² to make the growth rate of the first particles perpendicular to the first surface 201 and/or the second surface 202 of the conductive material layer 2 higher than the growth rate of the first particles horizontal to the first surface 201 and/or the second surface 202 of the conductive material layer 2. The second stage is to form first particles with a predetermined diameter by electroplating at a current density of 48 to 60 A/dm$^2$ and a total current of 70 to 90 As/dm$^2$ to make the growth rate of the first particles perpendicular to the first surface 201 and/or the second surface 202 of the conductive material layer 2 higher than the growth rate of the first particles horizontal to the first surface 201 and/or the second surface 202 of the conductive material layer 2. Each of the first particles 211 formed by abovementioned electroplated recipes has a diameter not greater than 0.45 μm, for example in the range of 0.25 to 0.45 μm.

The second particles 212 can be formed by selecting from one of the materials including cobalt, zinc and copper, nickel, phosphor, tungsten, arsenic, molybdenum, chromium, ferrum, vanadium, cobalt and zinc or the combinations thereof, and electroplating on the first particles 211 and concaves between adjacent first particles 211 at a current density of 10 to 33 A/cm$^2$ and a total current of 30 to 45 As/dm$^2$ by multiple stages. Each of the second particles 212 formed by abovementioned electroplated recipes has a diameter not greater than 0.25 μm, for example in the range of 0.05 to 0.25 μm. The roughness of the first surface-treated layer 21 formed by the first particles 211 and the second particles 212 is not greater than 1.5 μm, for example in the range of 1.0 to 1.5 μm.

Figure 2B:
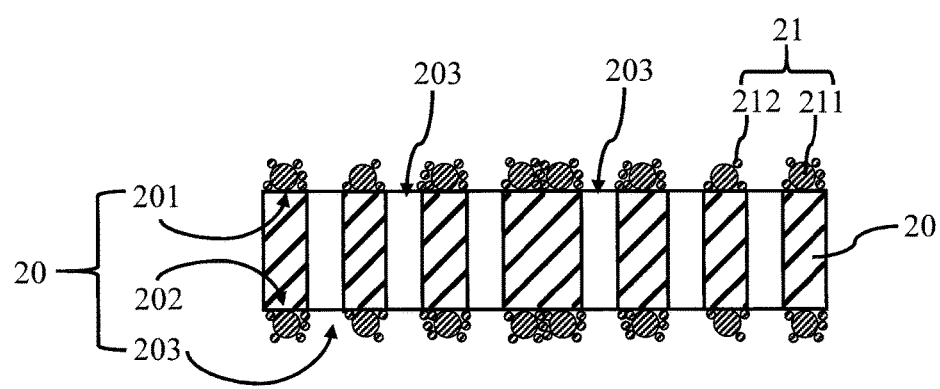

Next, at least one via hole 203 throughout the first surface 201 and the second surface 202 of the conductive material layer 20 as shown in FIG. 2B is formed by a mechanical drilling or laser drilling process. According to the current FPC layout, the diameter of the via hole 203 is not greater than 1 mm, for example but not limited to 0.1 mm, 0.05 mm or less. Furthermore, the via hole 203 can be cleaned by a basic detergent for example but not limited to ammonium hydroxide or ammonium chloride to remove residuals of conductive material layer 20, the first particles 211 and the second particles 212 generated during drilling to form the via hole 203 to prevent the FPC from short of circuit and degradation of insulating efficiency.

In the high frequency applications, a low-K insulating material with a dielectric constant not greater than 4, for example in the range of 2 to 4, can be chosen as the insulating structure 22 between wires to reduce the signal delay of the interconnectors of a printed circuit board. The thickness ration of the insulating structure 22 to the conductive material layer 20 is in the range of 1.5 to 2 to ensure the insulating structure 22 to fill up with the via hole 203 and cover the first surface-treated layer 21. The insulating structure 22 comprises a thermalplastic insulating material and/or a thermalsetting insulating material.

The thermalplastic insulating material can be a fluorine-containing resin for example but not limited to polytetrafluoroethylene (PTFE), tetrafluoroethylene-perfluoroalkyl vinyl ether copolymer (PFA), hexafluoropropene-tetrafluoroethylene copolymer (FEP), tetrafluoroethylene-hexafluoropropylene-perfluoroalkyl vinyl ether copolymer (EPE), tetrafluoroethylene-ethylene copolymer (ETFE), polyvinylidene difluoride (PVDF), poly(chlorotrifluoroethylene-co-vinylidene fluor (PCTFE), or ethylene-chlorotrifluoroethylene copolymer (ECTFE), or liquid crystal polymers (LCP) with low melt viscosity, low molding shrinkage, low water adsorption, low thermal coefficient, high molding efficiency, high blocking rate, high thermal statability, excellent mechanical and insulating properties for example but not limited to liquid crystal poly-esters, liquid crystal poly-ethers or liquid crystal poly-amides. The liquid crystal polymers disclosed in WO 2004/016673 are exemplarily used in this present invention.

The thermalsetting insulating material can be for example but not limited to polyimides (PI), polyamides, acrylic resins such as Para-Methoxymethamphetamine (PMMA), Acrylonitrile-Butadiene-Styrene resins (ABS resins), Phenolic resins, Epoxy resins, Polyesters, Silicones、Polyurethane (PU)、Polycarbonate (PC), Butyl rubbers, or combinations thereof. The thermalsetting materials disclosed in TW Patents I493007, I499608, I546322 and I600734 are exemplarily used in this present invention.

Figure 2C:
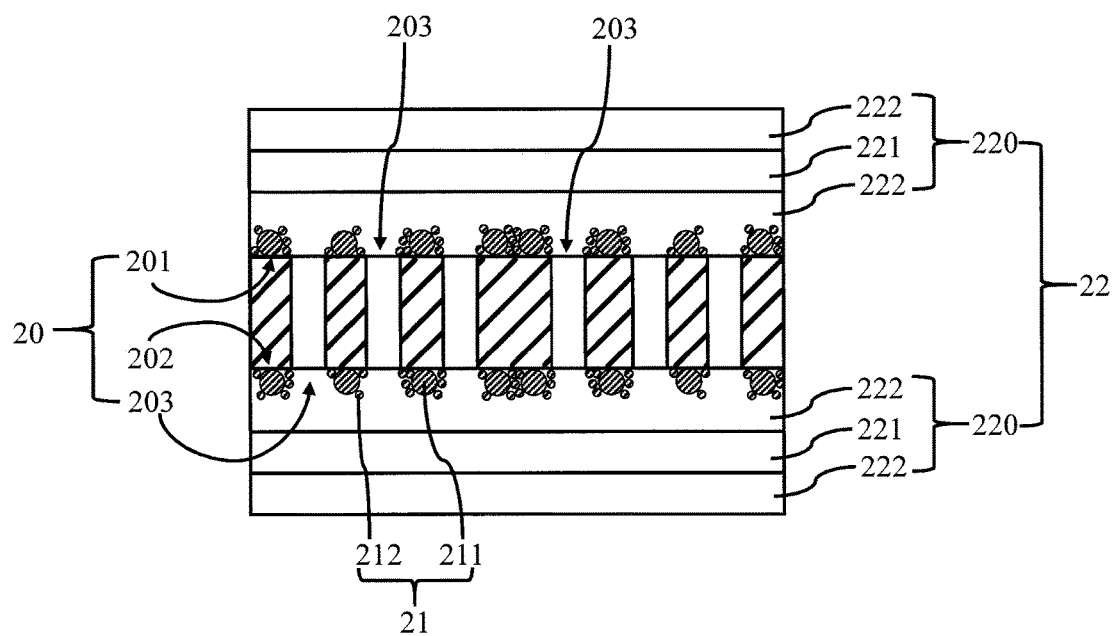
Figure 2C:
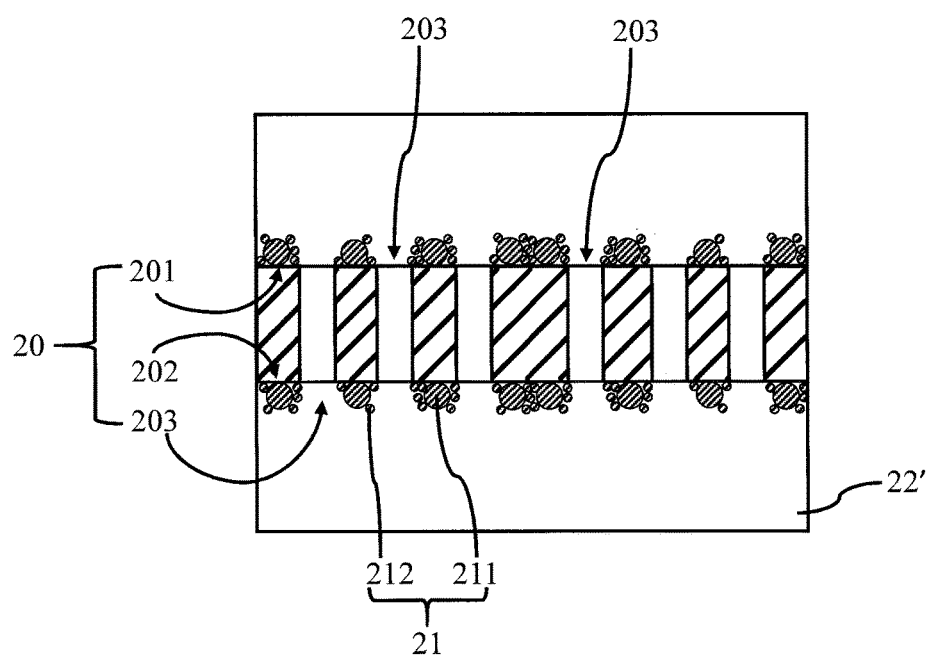

FIG. 2C illustrates the step of forming the insulating structure 22 by the combinations of the thermalsetting material and the thermalplastic material. As show in FIG. 2C, the insulating structure 22 is formed by the steps of: providing a first insulating material 221 between by two second insulating materials 222, and pressing the second insulating materials 222 and the first insulating material 221 to make the first insulating material 221 sandwiched by two second materials 222 to generate an insulating stacking layer 220; disposing the insulating stacking layer 220 on the first surface 201 and second surface 202 of the first surface-treated layer 21; hot pressing the insulating stacking layer 220 to make the second insulating material 222 of the insulating stacking layer 220 fill up with the via hole 203; and curing the second insulating material 222 to form the insulating structure 22.

According to one embodiment of this invention, the first insulating material 221 is a thermalsetting material, and the second insulating material 222 is a thermalplastic insulating material, and the insulating stacking layer 220 can be but not limited to PTFE-PI-PTFE, PFA-PI-PFA or LCP-PI-LCP. The insulating stacking layer 220 and the conductive material layer 20 are hot pressed at a temperature higher than the melting point of the insulating material to make the thermal plastic insulating material melt and fill up with the via hole 203, and the insulating structure 22 can be formed after the thermalplastic insulating material is cured.

According to another embodiment of this invention, the first insulating material 221 is a thermalplastic material, and the second insulating material 222 is a thermalsetting insulating material. It's well known that the harden procedure of a thermalsetting insulating material includes stage A, which is the beginning stage of a polymerization, wherein the thermalsetting insulating material is liquid and has a low molecular weight (M.W.); stage B, which is the middle stage of a polymerization, wherein the molecular structure is not cross-linked and the solid product can be melted to flow under a high temperature and soluble in solvents; and stage C, which is the terminal stage of a polymerization, wherein the molecular structure is cross-linked and the solid product can't be melted under a high temperature and insoluble in solvents. The insulating stacking layer 220 can be but not limited to (Epoxy resin/rubber mixtures)-fluorine-containing resin-(Epoxy resin/rubber mixtures), (Epoxy resin/rubber mixtures)-LCP-(Epoxy resin/rubber mixtures) or PI-fluorine-containing resin-PI, PI-LCP-PI. The abovementioned thermalsetting insulating material of stage B is solid at room temperature, and it will be melted to flow after heating to initiate the polymerization and cured to mold when the molecular structure is cross-linked at stage C. Therefore, the insulating stacking layer 220 and the conductive material layer 20 of this embodiment are hot pressed at a temperature higher than the melting point of the thermalsetting insulating material of stage B but lower than the melting the thermalplastic insulating material to make the thermalsetting insulating material flow and fill up with the via hole 203, and the insulating structure 22 can be formed after the thermalsetting insulating material is continuously heated to cure.

The linear thermal expansion coefficient of a thermalplastic insulating material is usually higher than that of a conductive material, and the conductive material layer 20 and the insulating stacking layer 22 might be warp when bended or operated under a high temperature. The warpage can be reduced by enhancing the compactness and peeling strength between the insulated stacking layer 22 and the conductive material layer 20 by the uneven profile of the first surface-treated layer 21 therebetween. The peeling strength of the FPC can be further be enhanced by physically or chemically modifying the first insulating material 221 and the second insulating material 222, for example by plasma treatment, ionization treatment, coupling agent treatment, corona treatment or sandblasting treatment.

According to another embodiment of this invention, the insulating stacking layer 22 can be formed by coating a second insulating material 222 on the first surface 201 and the second surface 202 of the first surface-treated layer 21, and make the second insulating material 222 fill into the via hole 203, then a first insulating material 221 is coated on the second insulating material 222. The insulating stacking layer 22 can be formed after the second insulating material 222 is cured.

FIG. 2C' illustrates the step of forming the insulating structure 22' by the thermalsetting material or the thermalplastic material. As show in FIG. 2C', an insulating material is disposed or coated on the first surface-treated layer 21 and filled up with the via hole 203, and the insulating structure 22' can be formed after hot pressing or curing. The insulating material for forming the insulating structure 22' can be a thermalplastic material or a thermalsetting material.

According to above method of manufacturing a FPC substrate, this invention provide a flexible circuit board substrate. As shown in FIG. 2C, the flexible circuit board substrate 2 comprises a conductive material layer 20, a first surface-treated layer 21 and an insulating structure 22. The conductive material layer 20 includes a first surface 201 and a second surface 202 opposite to each other, and at least one via hole 203 throughout the first surface 201 and the second surface 202. The first surface-treated layer 21 comprising a plurality of first particles 211 and a plurality of second particles 212 is formed on the first surface 201 and/or the second surface 202, wherein each of the first particles 211 has a diameter greater than that of each of the second particles 212. The insulating structure 22 is formed on the first surface-treated layer 21 and filled up with the via hole 203.

The flexible circuit board substrate 2 of this embodiment has a thickness of 6 to 70 μm. The first surface-treated layer 21 has a thickness of 0.25 to 0.45 μm and a roughness not greater than 1.5 μm. The first particles 211 are made of the material comprising copper, and the second particles 212 are made of the material comprising nickel, cobalt, copper or zinc. The insulating structure 22 with a dielectric coefficient not greater than 4 includes a polyimide (PI) layer sandwiched by two of the Polytetrafluoroethylene (PTFE), and the thickness ratio of the insulating structure to the conductive material layer 20 is in the range of 1.5 to 2.

This invention further provides a method of manufacturing a FPC with a wiring structure, comprising the steps of: providing a FPC manufactured according to above embodiment; forming a circuit layer on the insulating structure; forming a conductive channel throughout the circuit layer and the insulating structure, and; filling a conductive material into the conductive channel to formed a conductive plug.

Figure 2D:
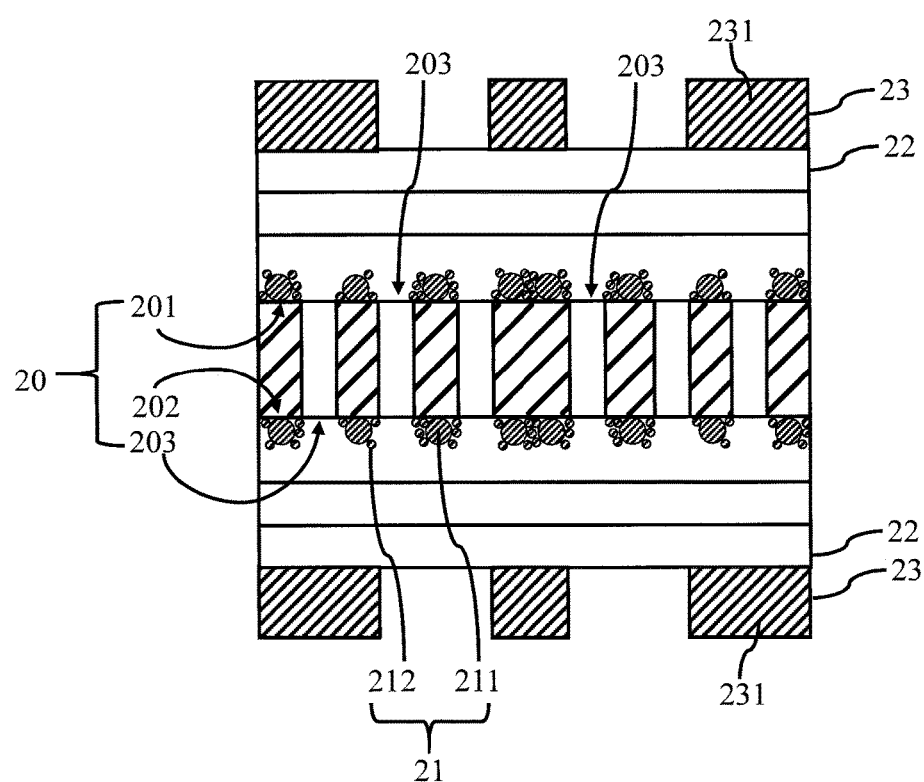
FIGS. 2D-2E are cross-sectional views illustrating a method of manufacturing a flexible printed circuit board substrate with a wiring structure according to another embodiment of this invention.
Figure 2E:
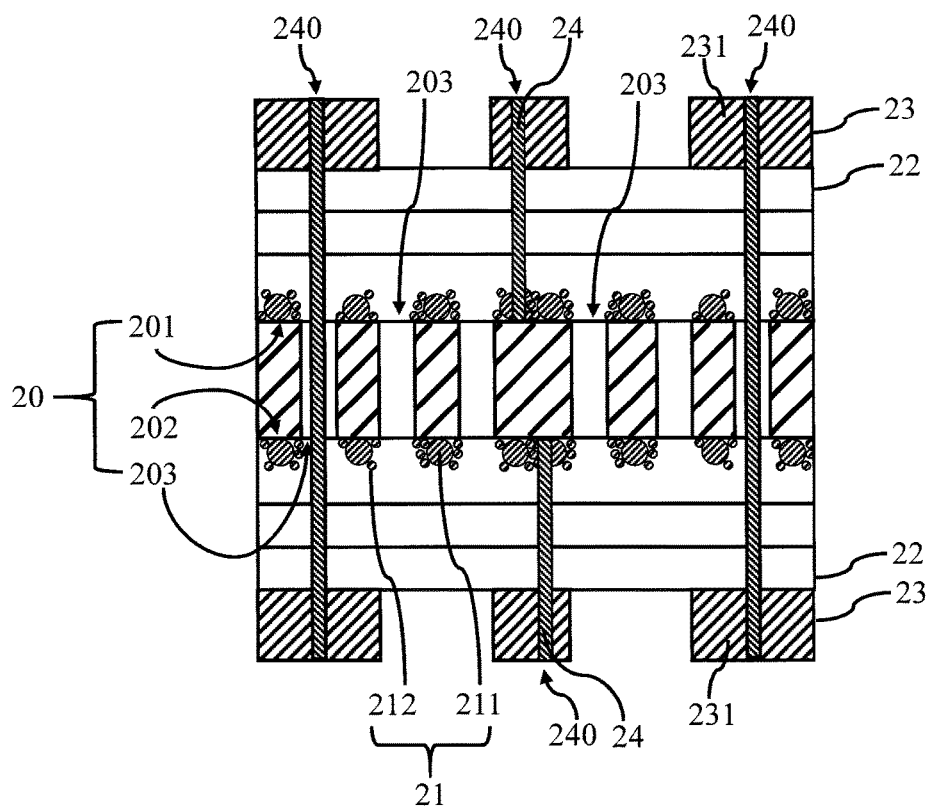

FIGS. 2D to 2E illustrate a method of manufacturing a flexible printed circuit board substrate with a wiring structure according to another embodiment of this invention. As shown in FIG. 2D, a flexible printed circuit board substrate 2 manufactured according to above embodiment is provided. Next, a wiring layer 23 is formed on the insulating structure 22 of the flexible printed circuit board substrate 2. The wiring layer is formed by the steps of: disposing two conductive films (not shown) such as copper coil, gold coil or aluminum coil on two opposite sides of the insulating structure 22; hot pressing or jointing the conductive films and the insulating structure 22; patterning the conductive films by photolithograpghy to form a wire layer 23 comprising a plurality wires 231.

In order to enhance the adhesion between the insulating structure 22 and the wire layer 23, the top and bottom surfaces of the insulating structure 22 can be pre-treated by for example but not limited to plasma treatment, ionization treatment, coupling agent treatment, corona treatment or sandblasting treatment before forming the wire layer 23. According to another embodiment of this invention, the surface of the conductive film for patterning to form the wire layer 23 can be coarsen by pretreated with metallic particles to form a second surface-treated layer (not shown).

As shown in FIG. 2E, the wires 231 and the insulating structure 22 are drilled by laser to form a conductive channel 240 throughout the wire layer 23 and via hole 203 and/or the conductive material layer 20, then the residuals of the conductive material and insulating materials remained in the conductive channel 240 generated during drilling are wash out by basic detergent. Next, a metal layer for example but not limited to a tungsten layer is deposited by CVD or electroplating to prevent the conductive material from diffusing into the insulating structure. Next, a conductive material like copper or copper alloy is filled up with the conductive channel 240 to form a conductive plug 24 which can connect the wires 231 through the via hole 203 or the conductive material layer 20.

According to above method of manufacturing a FPC with a wiring structure, this invention provide a flexible circuit board substrate with a wiring structure. As shown in FIG. 2E, the flexible circuit board substrate 2' comprises a conductive material layer 20, a first surface-treated layer 21, an insulating structure 22, a wiring structure 23 and a conductive plug 24. The conductive material layer 20 includes a first surface 201 and a second surface 202 opposite to each other, and at least one via hole 203 throughout the first surface 201 and the second surface 202. The first surface-treated layer 21 comprising a plurality of first particles 211 and a plurality of second particles 212 is formed on the first surface 201 and/or the second surface 202, wherein each first particle 211 has a diameter greater than that of each second particle 212. The insulating structure 22 is formed on the first surface-treated layer 21 and filled up with the via hole 203. The conductive plug 24 connects the wires 231 throughout the insulating structure 22, and the wires 231 connecting the conductive plug 24 to form a wiring structure of the flexible printed circuit board substrate 2'.

Figure 3A:
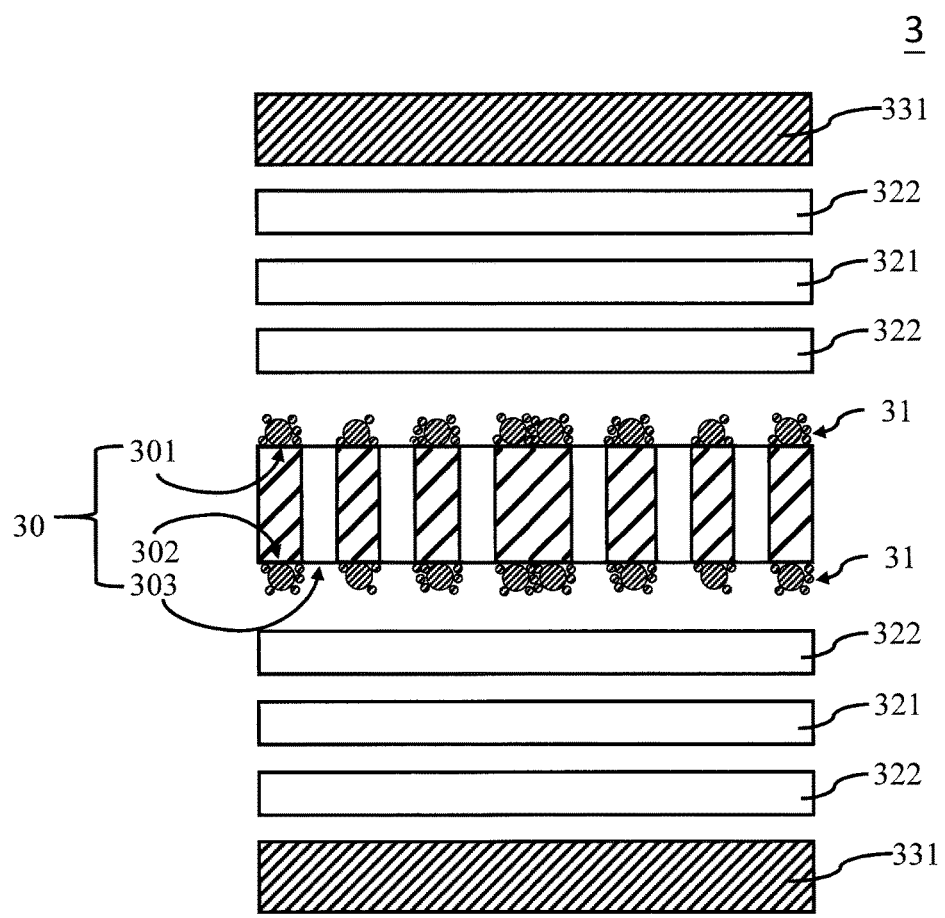
FIGS. 3A-3B are cross-sectional views illustrating another method of manufacturing a flexible printed circuit board substrate with a wiring structure according to another embodiment of this invention.
Figure 3B:
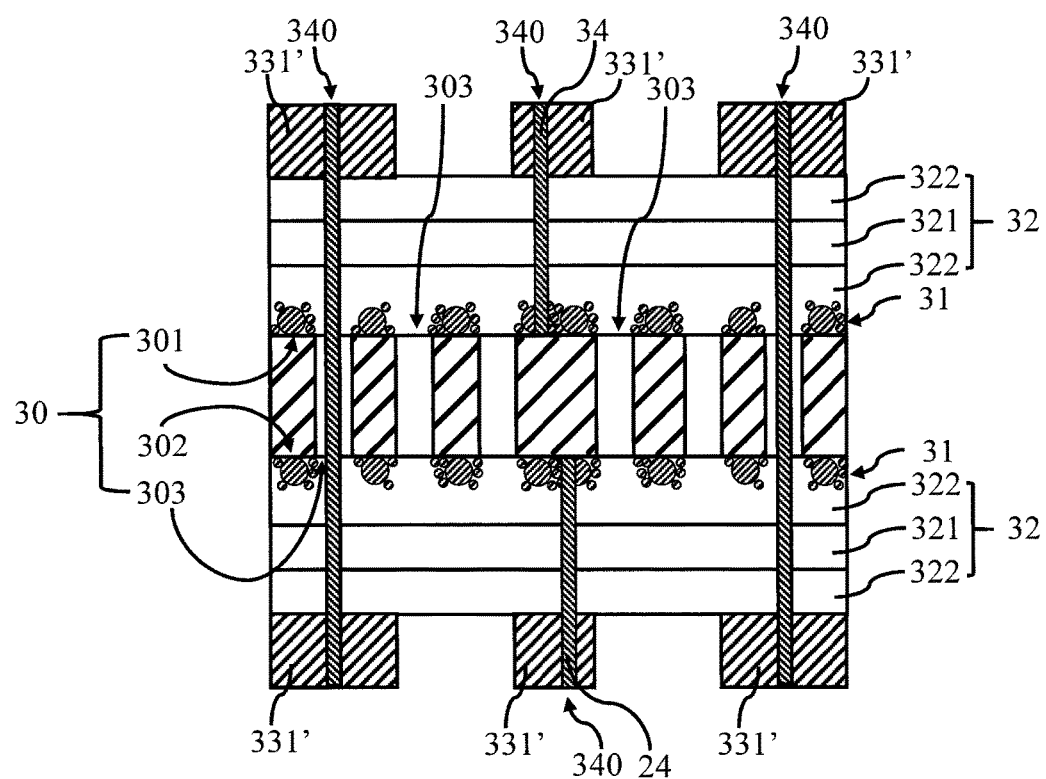

FIGS. 3A-3B are illustrated a method of manufacturing a flexible printed circuit board substrate with a wiring structure according to another embodiment of this invention. As shown in FIG. 3A, a conductive material 30 with a a first surface-treated layer 31 formed on the first surface 301 and/or the second surface 302 of the conductive material layer 30 and at least one via hole 303 throughout the first surface 301 and the second surface 302 manufactured according to the method mentioned above is provided. Next, a second insulating material 322, a first insulating material 321, a second insulating material 322 and a conductive film 331 are stacking on one side or both sides of the first surface-treated layer 31 in sequence.

As shown in FIG. 3B, the conductive material layer 30, the second insulating material 322, the first insulating material 321, the second insulating material 322 and the conductive film 331 are hot pressed by a hot pressing apparatus to make the second insulating material 321 joint to the first surface-treated layer 31 and the conductive film and filled up with the via hole 303, then an insulating structure 32 can be obtained after the second insulating material 322 is cured. Next, the conductive film 331 is patterned by photolithography to form a wire layer 33 comprising a plurality of wires 331'. Next, the wires 331 and the insulating structure 32 are drilled by laser to form a conductive channel 340 throughout the wire layer 23 and via hole 203 and/or the conductive material layer 30, then the residuals of the conductive material and insulating materials remained in the conductive channel 340 generated during drilling are wash out by basic detergent. Finally, a conductive material like copper or copper alloy is filled up with the conductive channel 340 to form a conductive plug 34 and generate a flexible printed circuit board substrate 3 with a wiring structure.

The above-mentioned flexible printed circuit board substrate with a wiring structure can be utilized as a FPC of a high frequency electronic apparatus, wherein the conductive material layer 20 is acting as a ground layer of a flexible printed circuit board (FPC) used in high frequency applications to provide functions of supporting and heat dissipation; the first surface-treated layer can prevent the FPC from peeling and warpage; the insulating structure has the advantages of low interference, noise resistance and avoidance of short; the wire layer is used to connect various electronic component (not shown); the conductive plug is acting as an interconnector of the electronic components to reduce the plain area of the FPC occupied by the wires. Accordingly, the size of the FPC can be highly shrunk and not to affect the numbers of electronic components to be arranged in the FPC.

To sum up, the flexible printed circuit board substrate and the method of manufacturing the same according to this invention, the conductive material layer functions to support, ground and dissipate heat; the surface-treated layer can the via hole can enhanced the adhesion and peeling strength between the conductive material layer and the insulating structure; the insulating structure filled up with the via hole ensure the conductivity and insulation of the conductive material layer. Therefore, this present invention not only solves the problems of peeling and warpage suffering by conventional FPC but also provides a FPC with a smaller size manufactured by a simplified process with a high yield rate and a low cost can be generated.

The invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A flexible circuit board substrate, comprising:
   a conductive material layer with a first surface, a second surface opposite to the first surface, and at least one via hole throughout the first surface and the second surface;
   a first surface-treated layer with a plurality of first particles and a plurality of second particles formed on the first surface and/or the second surface, wherein each first particle has a diameter greater than that of each second particle; and
an insulating structure formed on the first surface-treated layer and filled up with the via hole;
wherein the insulating structure comprises a thermalplastic insulating material and a thermalsetting insulating material, and the thermalsetting material is sandwiched by two of the thermalplastic materials.

2. The flexible circuit board substrate as claimed in claim 1 further comprising:
   a circuit layer formed on the insulating structure; and
   a conductive plug formed in one of the via holes to interconnect with the circuit layer.

3. A flexible circuit board substrate, comprising:
   a conductive material layer with a first surface, a second surface opposite to the first surface, and at least one via hole throughout the first surface and the second surface;
   a first surface-treated layer with a plurality of first particles and a plurality of second particles formed on the first surface and/or the second surface, wherein each first particle has a diameter greater than that of each second particle; and
   an insulating structure formed on the first surface-treated layer and filled up with the via hole;
   wherein the insulating structure comprises a thermalplastic insulating material and a thermalsetting insulating material, and the thermalplastic material is sandwiched by two of the thermalsetting materials.

4. The flexible circuit board substrate as claimed in claim 3 further comprising:
   a circuit layer formed on the insulating structure; and
   a conductive plug formed in one of the via holes to interconnect with the circuit layer.

* * * * *